(12) United States Patent
Powers

(10) Patent No.: US 6,642,531 B1
(45) Date of Patent: Nov. 4, 2003

(54) CONTAMINATION CONTROL ON LITHOGRAPHY COMPONENTS

(75) Inventor: James M. Powers, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/329,290

(22) Filed: Dec. 23, 2002

(51) Int. Cl.[7] .............................. G21G 5/00; G03F 9/00
(52) U.S. Cl. ........................... 250/492.2; 250/492.3; 250/372; 430/5; 430/270.1; 422/24
(58) Field of Search ..................... 250/492.2, 492.3, 250/372; 430/5, 270.1; 422/24

(56) References Cited

U.S. PATENT DOCUMENTS

| | | | |
|---|---|---|---|
| 5,311,098 A | * | 5/1994 | Seely et al. ................. 313/542 |
| 5,512,759 A | * | 4/1996 | Sweatt ..................... 250/492.1 |
| 5,989,776 A | * | 11/1999 | Felter et al. ............. 430/270.1 |
| 6,042,995 A | * | 3/2000 | White ........................ 430/311 |
| 6,316,150 B1 | * | 11/2001 | Gianoulakis et al. .......... 430/5 |

* cited by examiner

Primary Examiner—John R. Lee
Assistant Examiner—Paul M. Gurzo
(74) Attorney, Agent, or Firm—Paul J. Fordenbacher; Schwabe Williamson & Wyatt

(57) ABSTRACT

Contamination control apparatus and methods for the removal of particulate contamination on EUV mirrors and reflective masks are provided. Embodiments in accordance with the present invention involve providing a charge to the particles and moving them away from the reflective surface by electrostatic elements. An electron source and one or more electrostatic elements are positioned adjacent the reflective surface of the reflective component. The electron source is adapted to shower electrons onto the particles in an area above the reflective surface and on the reflective surface to provide a negative charge to the particles. The electrostatic elements are adapted to provide an attractive electrostatic charge to attract the negatively charged particles on and near the reflective surface.

20 Claims, 2 Drawing Sheets

CONTAMINATION CONTROL ON LITHOGRAPHY COMPONENTS

FIELD OF THE INVENTION

The present invention relates to extreme ultraviolet (EUV) lithography, and more particularly, to contamination control and mitigation on EUV components.

BACKGROUND OF INVENTION

Extreme ultraviolet lithography, which uses a source at 13.5 nm wavelength, is a promising technology for 0.1 micron integrated circuit (IC) fabrication. Since the absorption at that wavelength is very strong in all materials, EUV lithography employs Si/Mo multilayer mirrors and reflective masks as reflective optics, rather than refractive optics and through-the-mask reticles used in longer wavelength (optical) lithography. The strong absorption requires the use of reflective mask reticles, rather than through-the-mask reticles used in longer wavelength lithography. The EUV absorption also precludes the use of a pellicle to protect the reticle from particulate contamination.

There are many issues to be resolved in order to realize EUV lithography, such as, developing a powerful EUV source, robust components that direct the radiation (mirrors), and robust components that define the integrated circuit features (reticles). An EUV source with a collectable radiation power of 50 W to 150 W at over 5 kHz in the spectral range of 13–14 nm is required to achieve requirements for high volume manufacturing of 300 mm wafers. Laser-induced and electrical discharge gas plasma devices (EUV lamps) are under investigation as promising EUV sources. These sources generate EUV radiation by heating certain materials into a plasma to such a level, in the many 100,000's C, that the material emits EUV radiation. Potential source materials which emit EUV radiation at excited energy levels include xenon, oxygen, and lithium.

FIG. 1 is a side view of an EUV reflective mask 10. The reflective mask and, similarly EUV mirror (not shown), comprises a quartz substrate 12 upon which is deposited a multilayer coating 14 of silicon (Si) and molybdenum (Mo). In addition, the reflective mask 10 has a highly detailed absorber pattern 16 deposited on top of the Si/Mo multilayer coating 14. A common absorber material is chrome. The reflective mask 10 is held to an electrostatic chuck 18 controlled by a chuck voltage 36. The EUV incoming radiation 32 impinges the reflective mask 10 at an angle and is reflected as outgoing radiation 33.

The EUV sources are emitters of high velocity particles 20. The high velocity particles 20 are a source of harmful contamination to the reflective surfaces 17 upon which they impinge and deposit. The Si/Mo multilayer mirrors and reflective masks 10, herein after referred to as reflective components 11, are highly sensitive to particle 20 contamination. Assuming the particles 20 are large enough, the contamination will result in the printing of a defect in every exposure field.

Several methods are used in an attempt to address particle 20 control on EUV reflective components 11. One method uses debris shields (not shown) through which the incoming EUV radiation 32 is passed to catch or filter the particles 20. But in the effort to maximize photon illumination, the "mesh" size has to be a compromise between particle 20 pass-through rate and reduction in EUV power.

Another method uses electrostatic fields for particle 20 control, which relies on the induced polarization created on the particle 20 by the presence of a strong electrostatic field. This leads to poor particle 20 removal of electrically neutral particles with low polarizability. Another method uses thermophoresis, which relies on the presence of a thermal gradient between the reflective surface 17 and the area above it. Thermophoresis is only marginally successful in the removal of larger particles 20 from a reflective surface 17.

None of these methods address the needs for preventing particulate contamination nor removing the particles 20 that do land on the reflective surfaces 17. Therefore, even with these processes, periodic manual cleaning is still required. But the delicate multilayer coatings 14 used in EUV reflective components 11 cannot withstand harsh or frequent cleaning.

In order for EUV lithography to meet commercial requirements and demands, including reliability, productivity, and maintenance, configurations and methods are needed for providing contamination control for the EUV mirrors and reflective masks without interference with the transmission of the radiation.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Reference to the "reflective surface" is understood to include the reflective surface of the EUV reflective mask, including Si/Mo multilayer reflective masks, as well as the reflective surface of the EUV mirror, including Si/Mo multilayer mirrors. The embodiments in accordance with the present invention apply to both EUV reflective masks and mirrors, which are hereinafter referred to as "reflective components."

Figure 1:
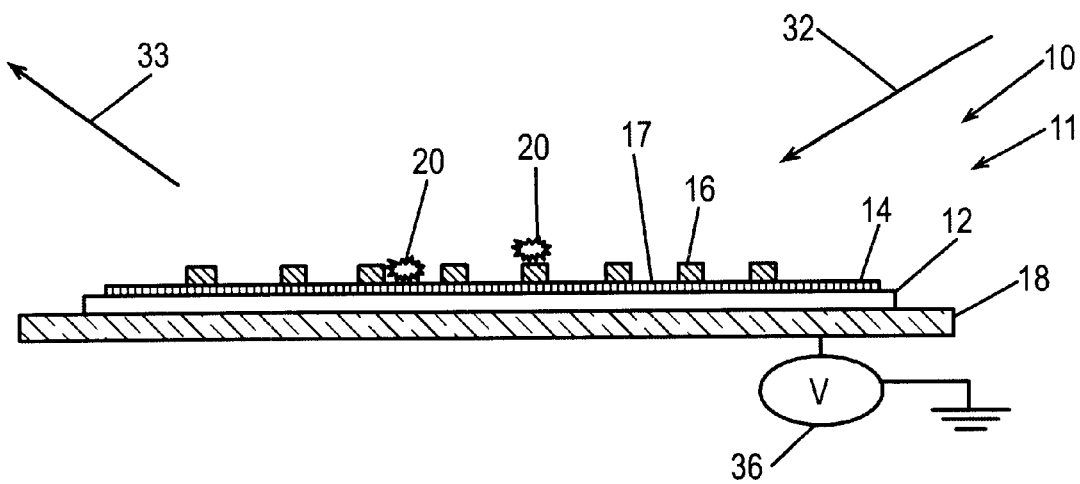
FIG. 1 is a side view of an EUV reflective mask.
Figure 2:
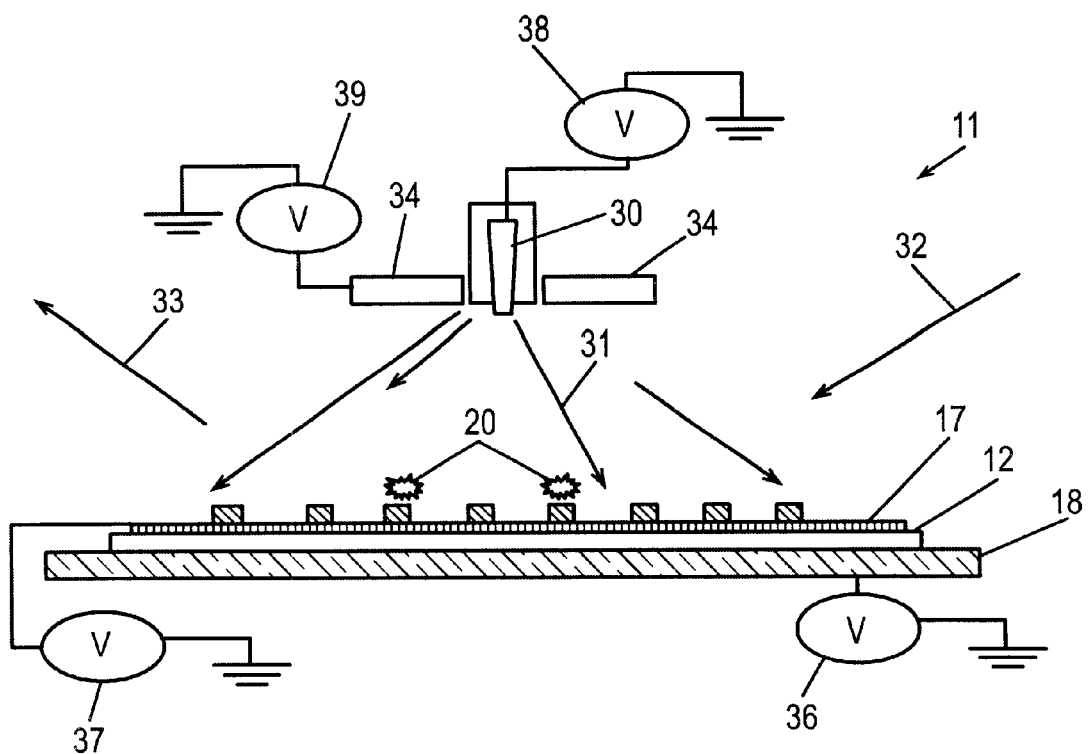
FIG. 2 is a side view of an apparatus in accordance with an embodiment of the present invention.

Embodiments in accordance with the present invention involve providing a charge to the particles and moving them away from the reflective surface by electrostatic elements. FIG. 2 is a side view of an apparatus in accordance with an embodiment of the present invention. An electron source 30 and one or more electrostatic elements 34 are positioned above the reflective surface 17 of the reflective component 11. The electron source 30 is adapted to shower electrons 31 onto the particles 20 in an area above the reflective surface 17 and on the reflective surface 17 to provide a negative charge to the particles 20.

The electrostatic elements 34 are adapted to provide an attractive electrostatic charge, in this embodiment, a positive charge, to attract the negatively charged particles 20 off of and away from the reflective surface 17. Configurations of the electrostatic elements 34 include, but not limited to, solid plates and charged screens.

Depending on the specific EUV reflective component 11 configuration, one or more electron sources 30 are required to completely shower the reflective surface 17 with electrons 31. For the sake of simplicity, FIG. 2 only shows one electron source 30. The type of electron source 30 is unimportant, so long as it can operate continuously in the vacuum atmosphere of the EUV system and does not deposit material upon the reflective surface 17.

In order to shower the reflective surface 17 with electrons 31, the electron source 30 must be electrically biased, with an electron source voltage 38, sufficiently negative relative to the reflective surface 17 in order to drive the electrons toward the reflective surface 17. In accordance with another embodiment of the present invention, the reflective surface 17 is provided with an electrical bias with a reflective surface voltage source 37 that attracts the electrons 31 from the electron source 30.

The electron source 30 provides the particles 20 with an overall negative charge via electron 31 bombardment. Care must be taken so as to not cause damage to the reflective surface 17. Care must also be taken to prevent the charging of the reflective component 11 to an excessive level, which could result in an electrostatic discharge between the reflective component 11 and its surroundings.

Incoming EV radiation 32 will generate secondary electrons at the reflective surface 17. However, the ability to electrically bias the electron source 30 provides control to overcome any detrimental effect. In another embodiment in accordance with the present invention, the electrostatic mounting chuck 18 is biased with a voltage source 36 to overcome any detrimental effect of the secondary electrons.

Once the reflective surface 17 and the particles 20 have been charged with electrons 31, the electron source 30 is turned off in preparation for the electrostatic elements 34 to attract the particles 20.

Figure 3:
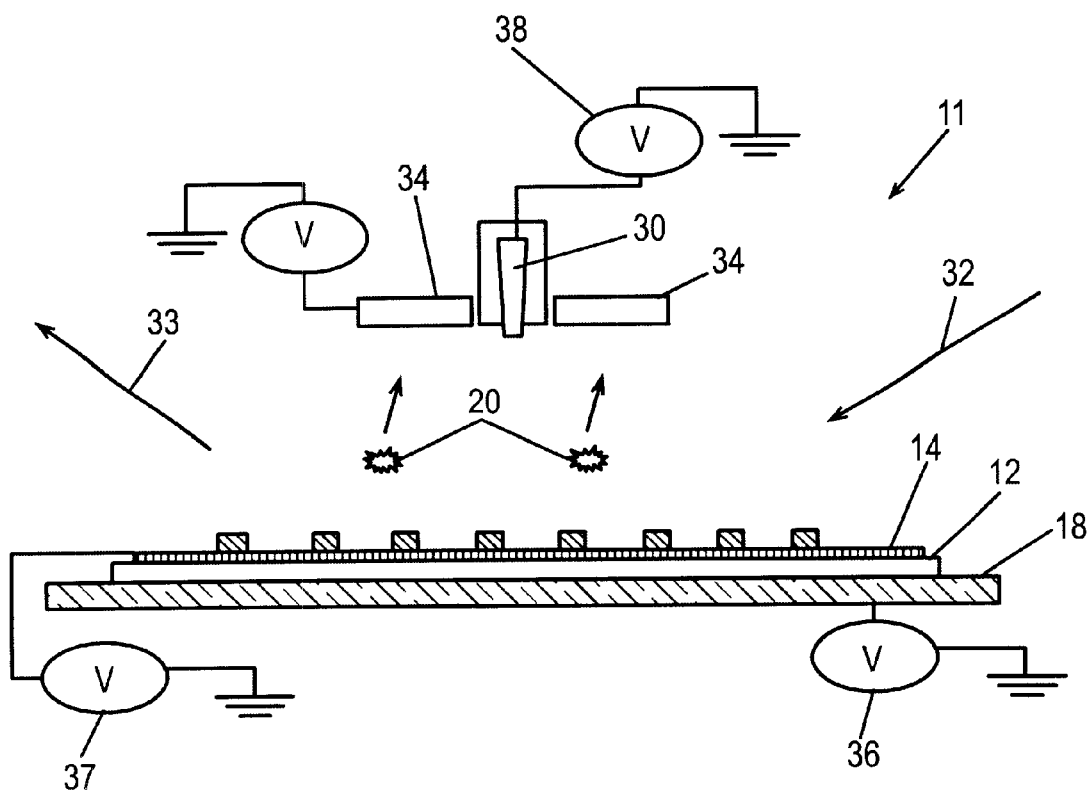
FIG. 3 is a side view of an apparatus in accordance with an embodiment of the present invention.

FIG. 3 is a side view of an apparatus to attract particles 20, in accordance with an embodiment of the present invention. The electrostatic elements 34 are adapted to provide a positive electrical bias relative to the reflective surface 17.

This positive bias draws the negatively charged particles 20 toward the electrostatic elements 34. As is the case with the electron source 30, one or more electrostatic elements 34 are required, although for simplicity, two are shown.

In another embodiment in accordance with the present invention, the reflective surface 17 is adapted to be biased negatively, such that, along with the positive bias of the electrostatic elements 34, the negatively charged particles 20 are driven off of the reflective surface 17 and toward the electrostatic elements 34.

The electrostatic elements 34 are located directly above the reflective surface 17. In another embodiment in accordance with the present invention, the electron source 30 and electrostatic elements 34 are located to the side of the reflective surface 17. Careful placement of the electrostatic elements 34 allows for the particles 20 that are repelled from the reflective surface 17 to be carried out of the vicinity of the reflective surface 17, allowing for disposal.

In addition, care must be taken when altering the electrostatic chuck voltage 36 applied to the electrostatic chuck 18 to drive particles 20 off the reflective surface 17. The discharge voltage step must be long enough to ensure the particles 20 are driven off the reflective surface 17 but not so long that the reflective surface 17 shifts on the chuck 18. This is not commonly an issue, since small particles 20 on the reflective surface 17 would react much faster to changes in the electric field than would the much larger reflective component 11.

In another embodiment of the present invention, in the event that excessive negative charge builds-up on the surface of the reflective surface 17, an ionized gas such as helium or argon is blown over the reflective surface 17 to dissipate the charge.

The embodiments also provide for the removal of particles 20 in the gas phase above the reflective surfaces 17 and also from the reflective surfaces 17. Gas phase species struck by the electrons 31 would also be attracted towards the electrostatic element 34, assuming the ionization process results in a positive ion.

Embodiments in accordance with the present invention use an electron source 30 to charge particles 20 found on the reflective surface 17. Once charged, the particles 20 are removed by providing an appropriate electrostatic field by the electrostatic elements 34. The embodiments do not require the flowing of reactive process gasses, which could absorb or distort the reflective surface 17. The embodiments do not require the particles 20 to be polarizable In another embodiment in accordance with the present invention, the reflective surface 17 and the electrostatic elements 34 are adapted to have a negative charge to attract and remove positively charged particles 20 from the reflective surface 17.

In another embodiment in accordance with the invention, an EUV system is provided having a contamination control apparatus adjacent the EUV reflective mask 10. In another embodiment, one or more EUV mirrors of the EUV system are also provided with a contamination control apparatus adjacent the EUV mirror.

A method for the control and removal of particulate contamination in accordance with the present invention, comprises: providing an electric charge to particles on and around the reflective component; and attracting the charged particles to electrostatic elements. In another embodiment, providing an electric charge to particles on and around the reflective component comprises showering the reflective surface and surrounding area with electrons from an electron source. In another embodiment, attracting the particles to electrostatic elements comprises electrically biasing electrostatic elements with a positive charge to attract the negatively charged particles. In another embodiment, attracting the particles to electrostatic elements further comprises electrically biasing the reflective surface to repel the particles away from the reflective surface. In the above embodiments, the electron source does not operate simultaneously with the electrostatic elements as the electrons will be attracted to the electrostatic elements without charging the particles.

The methods above illustrate a single particle charge/discharge cycle. The charge/discharge cycling could be performed before, during and/or after wafer processing. The optimal voltage settings and cycle times would be dependent on the exact configuration of the EUV system and reflective surface.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. Apparatus for particle contamination control on an EUV reflective surface, comprising:

one or more electron sources adapted to shower particles produced by an EUV source in the area around and on the reflective surface with electrons sufficient to impart a negative charge to particles therein; and one or more electrostatic elements adjacent the reflective surface having a positive charge sufficient to attract the particles off of and from around the reflective surface.

2. The apparatus of claim 1, wherein the reflective surface is adapted to be electrically biased sufficient to repel the particles.

3. The apparatus of claim 1, wherein the one or more electron sources are positioned above the reflective surface.

4. The apparatus of claim 1, wherein the one or more electron sources are positioned to the side of the reflective surface.

5. The apparatus of claim 1, wherein the one or more electrostatic elements are positioned above the reflective surface.

6. The apparatus of claim 1, wherein the one or more electrostatic elements are positioned to the side of the reflective surface.

7. The apparatus of claim 1, wherein the reflective surface is adapted to be electrically biased sufficient to repel the particles, the reflective surface comprising an EUV mirror having a quartz substrate upon which are alternating layers of silicon and molybdenum.

8. The apparatus of claim 1, the reflective surface comprising an EUV reflective mask having a quartz substrate upon which are multilayers of silicon and molybdenum, and an absorber pattern upon the multilayers.

9. The apparatus of claim 1, the reflective surface comprising an EUV mirror having a quartz substrate upon which are alternating layers of silicon and molybdenum.

10. The apparatus of claim 1, wherein the reflective surface is adapted to be electrically biased sufficient to repel the particles, the reflective surface comprising an EUV reflective mask having a quartz substrate upon which are multilayers of silicon and molybdenum, and an absorber pattern upon the multilayers.

11. An EUV lithography system with contamination control apparatus for one or more EUV reflective surfaces, comprising:

an EUV lithography system having an EUV source that produces particles; and a contamination control apparatus adjacent at least one of the EUV reflective surfaces, the contamination control apparatus comprising:

one or more electron sources adapted to shower the particles in the area around and on the reflective surface with electrons sufficient to impart a negative charge to particles therein; and one or more electrostatic elements adjacent the reflective surface having a positive charge sufficient to attract the particles off of and from around the reflective surface.

12. The apparatus of claim 11, wherein the at least one of the reflective surfaces is adapted to be electrically biased sufficient to repel the particles.

13. The apparatus of claim 11, wherein the at least one of the reflective surfaces comprise an EUV mirror having a quartz substrate upon which are alternating layers of silicon and molybdenum.

14. The apparatus of claim 11, wherein the at least one of the reflective surfaces comprises an EUV reflective mask having a quartz substrate upon which are multilayers of silicon and molybdenum, and an absorber pattern upon the multilayers.

15. A method for controlling contamination on reflective surfaces, comprising:

using a charging source to electrically charge particles produced by an EUV source on and in the area around a reflective surface of an EUV apparatus; and attracting the charged particles to electrostatic elements adjacent the reflective surface having an opposite charge sufficient to attract the particles off of and from the area around the reflective surface.

16. The method of claim 15, wherein providing an electric charge to particles on and in the area around a reflective surface comprises:

showering the reflective surface and surrounding area with electrons from an electron source negatively charging the particles.

17. The method of claim 16, wherein attracting the negatively charged particles to electrostatic elements comprises:

electrically biasing electrostatic elements with a positive charge to attract the negatively charged particles.

18. The method of claim 16, wherein showering the reflective surface and surrounding area with electrons from an electron source comprises showering the reflective surface and surrounding area with electrons from an electron source prior to attracting the charged particles to electrostatic elements.

19. The method of claim 16, wherein attracting the charged particles to electrostatic elements comprises attracting the charged particles to electrostatic elements subsequent to showering the reflective surface and surrounding area with electrons from an electron source.

20. The method of claim 15, wherein attracting the particles to electrostatic elements further comprises electrically biasing the reflective surface with the same electrical charge as the charged particles to repel the charged particles away from the reflective surface.

* * * * *

UNITED STATES PATENT AND TRADEMARK OFFICE
CERTIFICATE OF CORRECTION

PATENT NO.   : 6,642,531 B1
DATED        : November 4, 2003
INVENTOR(S)  : Powers It is certified that error appears in the above-identified patent and that said Letters Patent is hereby corrected as shown below:

Column 6,
Line 50, "20. The method of claim 15," should read -- 18. The method of claim 15, --.
Line 39, "18. The method of claim 16," should read -- 19. The method of claim 16, --.
Line 45, "19. The method of claim 16" should read -- 20. The method of claim 16, --.

Signed and Sealed this

Twenty-eighth Day of December, 2004

JON W. DUDAS
*Director of the United States Patent and Trademark Office*